United States Patent
Lee et al.

(10) Patent No.: US 9,864,221 B2
(45) Date of Patent: Jan. 9, 2018

(54) DISPLAY APPARATUS

(71) Applicant: Samsung Display Co., Ltd., Yongin, Gyeonggi-do (KR)

(72) Inventors: Hyunwoo Lee, Seoul (KR); Chunghui Lee, Cheongju-si (KR); Byungchan Kim, Suwon-si (KR); Juhwan Kim, Cheonan-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 179 days.

(21) Appl. No.: 14/682,982

(22) Filed: Apr. 9, 2015

(65) Prior Publication Data

US 2016/0028042 A1     Jan. 28, 2016

(30) Foreign Application Priority Data

Jul. 23, 2014   (KR) ........................ 10-2014-0093340

(51) Int. Cl.
*H05K 1/00* (2006.01)
*G02F 1/1333* (2006.01)
*H01L 27/32* (2006.01)
*G06F 1/16* (2006.01)

(52) U.S. Cl.
CPC .. *G02F 1/133308* (2013.01); *G02F 1/133305* (2013.01); *G02F 2001/13332* (2013.01); *G02F 2001/133314* (2013.01); *G06F 1/16* (2013.01); *H01L 27/3244* (2013.01); *H01L 2251/5338* (2013.01)

(58) Field of Classification Search
CPC ......... G02F 1/133305; G02F 1/133308; G02F 2001/133314; G02F 2001/13332; G06F 1/16; H01L 2251/5338; H01L 27/3244
See application file for complete search history.

(56) References Cited

U.S. PATENT DOCUMENTS

| | | | |
|---|---|---|---|
| 6,411,353 B1 * | 6/2002 | Yarita | G02F 1/133308 349/150 |
| 6,885,032 B2 * | 4/2005 | Forbes | G02F 1/1334 257/72 |
| 2007/0058118 A1 * | 3/2007 | Cirkel | G02F 1/133305 349/117 |
| 2009/0015747 A1 * | 1/2009 | Nishizawa | G02F 1/133308 349/58 |

(Continued)

FOREIGN PATENT DOCUMENTS

| KR | 10-1097842 B1 | 12/2011 |
|---|---|---|
| KR | 10-2013-0117110 A | 10/2013 |

(Continued)

*Primary Examiner* — Yuriy Semenenko
(74) *Attorney, Agent, or Firm* — Knobbe, Martens, Olson & Bear, LLP

(57) ABSTRACT

A display apparatus is disclosed. In one aspect, the display apparatus includes a flexible display panel configured to display images and a first frame arranged on the front surface of the flexible display panel and curved in a first direction. The display apparatus also includes a second frame arranged on a rear surface of the flexible display panel and curved in the first direction and a spacer arranged on at least one of the first and second frames. The spacer is configured to adjust the distance between the first and second frames.

18 Claims, 9 Drawing Sheets

(56) References Cited

U.S. PATENT DOCUMENTS

| | | | | |
|---|---|---|---|---|
| 2010/0253873 | A1* | 10/2010 | Kretz | G02F 1/133308 349/58 |
| 2013/0321740 | A1* | 12/2013 | An | H05K 5/0217 349/58 |
| 2015/0035812 | A1* | 2/2015 | Shin | G09G 3/3688 345/204 |

FOREIGN PATENT DOCUMENTS

| | | | |
|---|---|---|---|
| KR | 10-2014-0007689 | A | 1/2014 |
| KR | 10-1420329 | B1 | 7/2014 |

* cited by examiner

DISPLAY APPARATUS

CROSS-REFERENCE TO RELATED APPLICATION

This U.S. non-provisional patent application claims priority under 35 U.S.C. § 119 of Korean Patent Application No. 10-2014-0093340, filed on Jul. 23, 2014, the contents of which are hereby incorporated by reference in its entirety.

BACKGROUND

Field

The described technology generally relates to a display apparatus.

Description of the Related Technology

Various electronic devices, such as smart phones, digital cameras, notebook computers, navigation systems, television sets, etc., include a display apparatus to display images.

In recent years, curved displays have been developed. These curved displays include a curved display area which can increase the three-dimensional effects and the sense of immersion (or immersiveness) of the displayed image.

SUMMARY OF CERTAIN INVENTIVE ASPECTS

One inventive aspect is a display apparatus having a variable curvature.

Another aspect is a display apparatus that can be selectively operated in a flat mode and a curved mode.

Another aspect is a display apparatus including a flexible display panel maintained in a flat mode or a curved mode according to a degree of bending thereof to display an image on a front surface thereof, a first frame arranged on the front surface of the flexible display panel and partially curved along a first direction, a second frame arranged on a rear surface of the flexible display panel and partially curved along the first direction, and a spacer arranged on at least one of the first and second frames to adjust a distance between the first and second frames.

The first and second frames are provided along edges of the display panel.

When the distance between the first and second frames is referred to as a first distance in the flat mode and the distance between the first and second frames is referred to as a second distance in the curved mode, the first distance is greater than the second distance. The second distance is equal to a thickness of the display panel.

The display panel is curved along the first direction when the display panel is in the curved mode and the edges of the display panel contact the first frame.

The first frame includes a pair of first sides substantially parallel to each other and a pair of second sides substantially parallel to each other.

The first sides are curved along the first direction and the second sides are curved along a second direction substantially perpendicular to the first direction.

A portion of the first sides has a first curvature and the other portion of the first sides has a second curvature different from the first curvature.

The display apparatus further includes a first fixing part arranged at a center of the first sides between the first frame and the display panel and contacting the display panel to fix the display panel. The display apparatus further includes a second fixing part arranged at both ends of the first sides between the display panel and the second frame and contacting the display panel to fix the display panel.

The spacer is provided in a plural number. The spacer is realized by a gear system configured to include a rack and a pinion.

Another aspect is a display apparatus comprising a flexible display panel configured to display images; a first frame arranged on the front surface of the flexible display panel and curved in a first direction; a second frame arranged on a rear surface of the flexible display panel and curved in the first direction; and at least one spacer arranged on at least one of the first and second frames, wherein the spacer is configured to adjust the distance between the first and second frames.

In certain embodiments, the first and second frames are arranged along edges of the display panel. The flexible display panel can be further configured to i) have a substantially flat shape when the distance between the first and second frames is a first distance and ii) have a curved shape when the distance between the first and second frames is a second distance and the first distance can be greater than the second distance. The second distance can be substantially equal to the thickness of the display panel. The display panel can be curved in the first direction when the display panel has the curved shape and the edges of the display panel can contact the first frame when the display panel has the curved shape. The first frame can comprise a pair of first sides substantially parallel to each other and a pair of second sides substantially parallel to each other.

In certain embodiments, the first sides are curved in the first direction. The second sides can be curved in a second direction substantially perpendicular to the first direction. A portion of the first sides can have a first curvature and the remaining portion of the first sides can have a second curvature different from the first curvature. The display apparatus can further comprise a first fixing part arranged at the center of the first sides between the first frame and the display panel, wherein the first fixing part is configured to: i) contact the display panel and ii) fix the display panel. The display apparatus can further comprise a second fixing part arranged at opposing ends of the first sides between the display panel and the second frame, wherein the second fixing part is configured to: i) contact the display panel and ii) fix the display panel.

In certain embodiments, the at least one spacer comprises a plurality of spacers. The spacers can be arranged at positions corresponding to at least two vertices of the display panel. Each of the spacers can comprise a rack connected to one of the first and second frames and a pinion connected to the other of the first and second frames. Each of the spacers can comprise a first rack arranged on the first frame; a first pinion engaged with the first rack; a second rack arranged on the second frame; a second pinion engaged with the second rack; and a link connecting the first pinion to the second pinion.

Another aspect is a display apparatus comprising a flexible display panel configured to operate in a flat mode and a curved mode, wherein the flexible display panel comprises a display area configured to display images and a non-display area surrounding the display area; a pair of frames formed on opposing sides of the display area and overlapping the non-display area of the flexible display panel; and a spacer arranged between the pair of frames and configured to transition the flexible display panel between the flat mode and the curved mode.

In certain embodiments, at least one of the frames does not overlap the display area of the flexible display panel. The curvature of the flexible display panel can be configured to substantially match the curvature of the pair of frames in the curved mode.

According to at least one embodiment, the display apparatus can be easily converted between the flat mode and the curved mode by adjusting the distance between the first and second frames.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION OF CERTAIN INVENTIVE EMBODIMENTS

Figure 1:
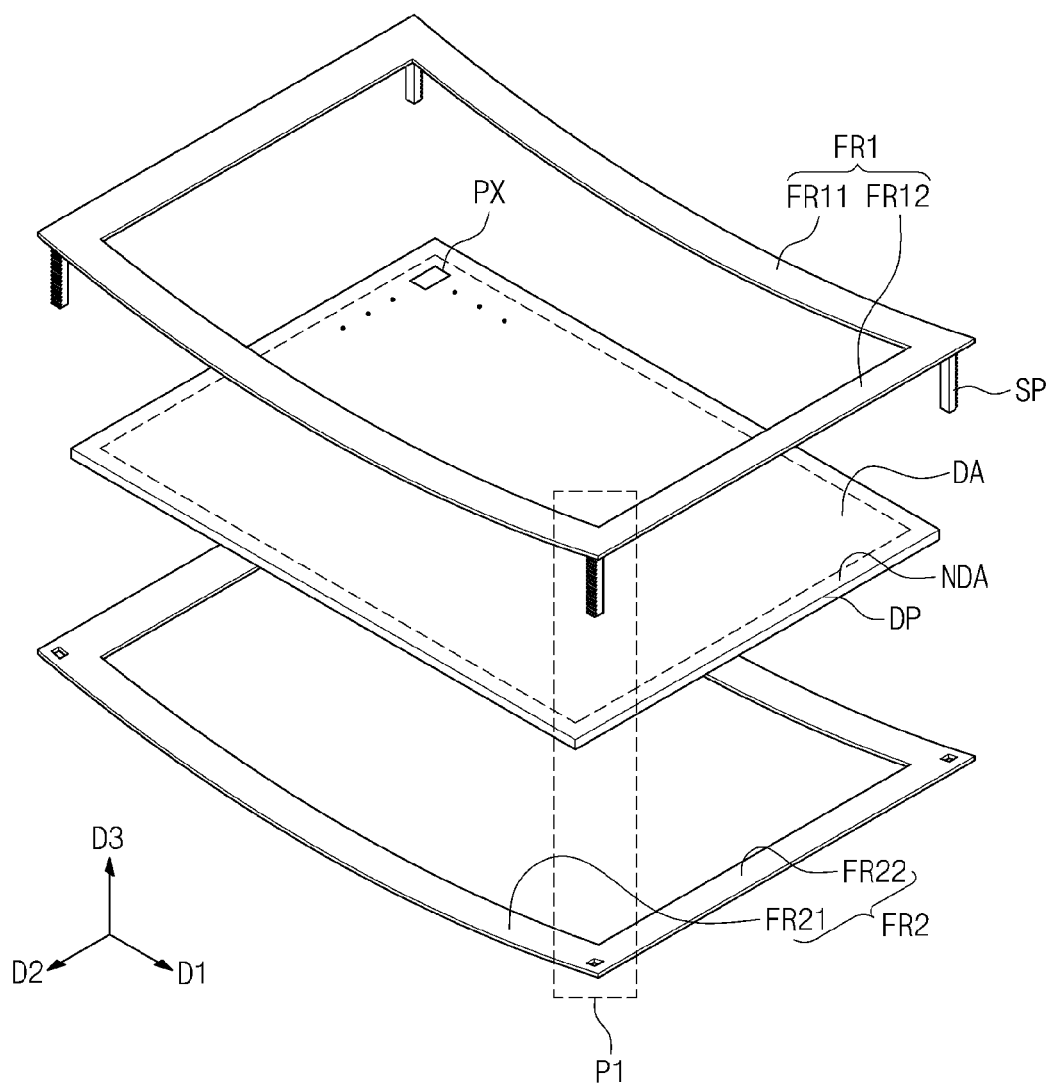
FIG. 1 is an exploded perspective view showing a display apparatus according to an exemplary embodiment.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the described technology.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the described technology. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the described technology belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the described technology will be explained in detail with reference to the accompanying drawings.

Figure 2:
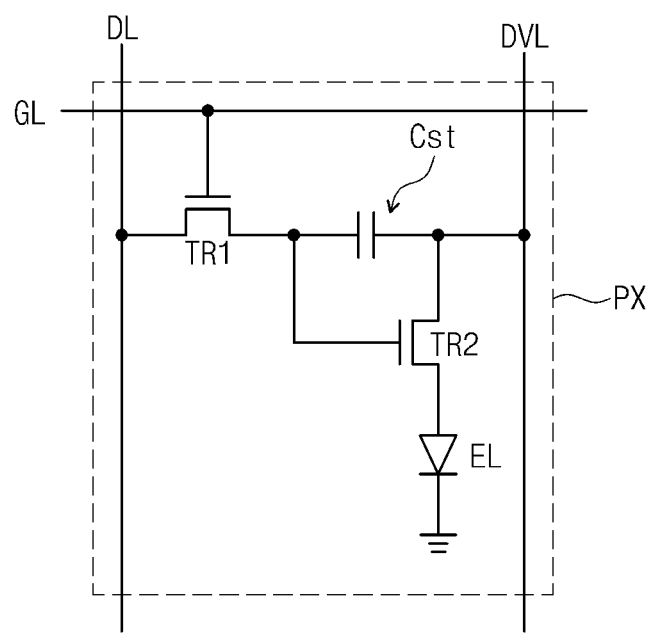
FIG. 2 is a circuit diagram showing one pixel of a display panel according to an exemplary embodiment.

FIG. 1 is an exploded perspective view showing a display apparatus according to an exemplary embodiment. FIG. 2 is a circuit diagram showing one pixel of a display panel according to an exemplary embodiment.

Referring to FIG. 1, the display apparatus includes a display panel DP displaying an image in a front direction with a front surface, a first frame FR1 formed on the front surface of the display panel DP, a second frame FR2 formed on a rear surface of the display panel DP, and a spacer SP controlling the distance between the first frame FR1 and the second frame FR2.

The display panel DP has a substantially plate-like shape including a front surface on which the image is displayed and a rear surface opposing the front surface. The display panel DP is flexible and elastic. The display panel DP maintains a substantially flat shape when no external force is applied thereto and is curved when the external force is applied thereto. When the external force disappears, the curved display panel DP returns to its original shape, i.e., the flat shape, due to its elasticity.

In some embodiments, the display panel DP has a rectangular shape with a pair of long sides and a pair of short sides. In the exemplary embodiment of FIG. 1, the direction in which the long sides extend is referred to as a first direction D1, the direction in which the short sides extend is referred to as a second direction D2, and the direction substantially perpendicular to the first and second directions is referred to as a third direction. The image is displayed in the third direction D3. For the convenience of explanation, the directions respectively corresponding to the front and rear surfaces of the display panel DP are substantially the same as those of front and rear surfaces of other components of the display apparatus.

The display panel DP includes a display area DA in which the image is displayed and a non-display area NDA adjacent to at least one side of the display area DA. In the embodiment of FIG. 1, the non-display area NDA surrounds the display area DA.

In the present exemplary embodiment, the display panel DP is a self-emissive display panel such as an organic light-emitting diode (OLED) display panel, but it should not be limited thereto. According to another embodiment, the display panel is a non-self-emissive display panel, e.g., a liquid crystal display (LCD) panel, an electrowetting display (EWD) panel, an electrophoretic display (EPD) panel, a microelectromechanical system (MEMS) display panel, etc.

Hereinafter, an OLED display panel will be described as a representative example of the display panel DP.

The display panel DP includes a plurality of pixels PX arranged in the display area DA in a matrix. Each pixel PX displays the image in response to signals applied thereto.

Referring to FIG. 2, each pixel PX includes a wiring including a gate line GL, a data line DL, and a driving voltage line DVL. Each pixel PX further includes a thin film transistor connected to the wiring, an OLED EL connected to the thin film transistor, and a capacitor Cst.

The gate line GL extends in one direction and the data line extends in a different direction from the one direction to cross the gate line GL. The driving voltage line DVL extends in substantially the same direction as the data line DL. The gate line GL applies a gate signal to the thin film transistor, the data line DL applies a data signal to the thin film transistor, and the driving voltage line DVL applies a driving voltage to the thin film transistor.

The thin film transistor includes a driving thin film transistor TR2 to control the OLED EL and a switching thin film transistor TR1 to apply the data voltage to the driving thin film transistor TR2. In the present exemplary embodiment, one pixel PX includes two thin film transistors TR1 and TR2, but the number of the thin film transistors should not be limited to two. That is, one pixel PXL can include one thin film transistor and one capacitor or can include three or more thin film transistors and two or more capacitors.

The switching thin film transistor TR1 includes a gate electrode connected to the gate line GL, a source electrode connected to the data line DL, and a drain electrode connected to a gate electrode of the driving thin film transistor TR2. The switching thin film transistor TR1 applies the data signal received through the data line DL to the driving thin film transistor TR2 in response to the gate signal received through the gate line GL.

The driving thin film transistor TR2 includes the gate electrode connected to the drain electrode of the switching thin film transistor TR1, a source electrode connected to the driving voltage line DVL, and a drain electrode connected to the OLED EL.

The OLED EL includes a light-emitting layer (not shown), a first electrode (not shown), and a second electrode (not shown) opposing the first electrode such that the light-emitting layer is interposed between the first and second electrodes. The first electrode is connected to the drain electrode of the driving thin film transistor TR2. The second electrode receives a common voltage and the light-emitting layer emits light in response to an output signal from the driving thin film transistor TR2, thereby displaying the image. In an embodiment, the light emitted from the light-emitting layer is a white light or a color light.

The capacitor Cst is connected between the gate electrode of the driving thin film transistor TR2 and the source electrode of the driving thin film transistor TR2. The capacitor Cst receives the data signal input to the gate electrode of the driving thin film transistor TR2 and stores the data signal. Accordingly, each pixel PX is turned on in response to the gate signal and the turned-on pixel PX receives the data signal, to thereby display the desired image.

The first frame FR1 is formed on the front surface of the display panel DP. The first frame FR1 supports an edge of the front surface of the display panel DP. The first frame FR1 includes a display window WD formed therethrough to expose the display area DA of the display panel DP. In some embodiments, the first frame FR1 has an area that is greater than that of the display panel DP to cover the edge of the display panel DP.

The first frame FR1 includes a pair of first sides FR11 corresponding to the long sides of the display panel DP and a pair of second sides FR12 corresponding to the short sides of the display panel DP. At least one of the first sides FR11 and the second sides FR12 is curved in a predetermined direction.

In the present exemplary embodiment, the first sides FR11 are curved in the first direction D1 and the second sides FR12 extend to be substantially straight without being curved, but they should not be limited thereto or thereby. That is, in other embodiments, only the second sides FR12 are curved in the second direction D2 and the first sides FR11 are not curved. In yet other embodiments, the first sides FR11 are curved in the first direction D1 and the second sides FR12 are curved in the second direction D2.

The second frame FR2 is formed on the rear surface of the display panel DP. The second frame FR2 supports an edge of the rear surface of the display panel DP. The second frame FR2 has substantially the same shape as that of the first frame FR1 and overlaps the first frame FR1 when viewed in a plan view. For instance, similar to the first frame FR1, the second frame FR2 has an area that is greater than that of the display panel DP to cover the edge of the display panel DP.

In the present exemplary embodiment, the second frame FR2 includes a pair of third sides FR21 corresponding to the long sides of the display panel DP and a pair of fourth sides FR22 corresponding to the short sides of the display panel DP. The third sides FR21 of the second frame FR2 correspond to the first sides FR11 of the first frame FR1 and the fourth sides FR22 of the second frame FR2 correspond to the second sides FR12 of the first frame FR1.

At least one of the third sides FR21 and the fourth sides FR22 is curved in a predetermined direction.

In the present exemplary embodiment, the third sides FR21 are curved in the first direction D1 and the fourth sides FR22 extend to be substantially straight without being curved, but they should not be limited thereto or thereby. That is, in other embodiments, only the fourth sides FR22 are curved in the second direction D2 and the third sides FR21 are not curved. In yet other embodiments, the third sides FR21 are curved in the first direction D1 and the fourth sides FR22 are curved in the second direction D2.

In some embodiments, the second frame FR2 includes an opening such that the second frame FR2 supports the display panel DP and maintains the shape of the display panel DP together with the first frame FR1. For instance, the second frame FR2 may include the third sides FR21 and portions of the fourth sides FR22. In particular, a center portion of the straightly-extending portion of the second frame FR2 is omitted and only end portions of the straightly-extending portion of the second frame FR2 remain.

In the present exemplary embodiment, the bending of the first sides FR11 and the second sides FR12 varies depending on the position of the user with respect to the display panel DP. The display apparatus is curved in the direction in which the user views the display apparatus such that the user views the image displayed from the curved display screen, i.e., the display area DA.

The spacer SP is arranged on the first frame FR1 or the second frame FR2 to adjust the distance between the first and second frames FR1 and FR2. The spacer SP adjusts the distance between the first and second frames FR1 and FR2 to correspond to a predetermined distance, e.g., a thickness of the display panel DP, or adjusts the distance between the first and second frames FR1 and FR2 to be greater than the predetermined distance, thereby changing the shape of the display panel DP.

The spacer SP is provided in at least one or more locations and is arranged between the first and second frames FR1 and FR2. For instance, four spacers SP are provided between the first and second frames FR1 and FR2, and in this embodiment, four spacers are provided between the first and second frames FR1 and FR2 and arranged at four locations respectively corresponding to four vertices of each of the first and second frames FR1 and FR2.

In the present exemplary embodiment, the spacers SP are provided at positions corresponding to at least two vertices of the four vertices of the display panel DP to stably adjust the distance between the first and second frame FR1 and FR2.

However, the number of the spacers SP should not be limited to a specific number as long as the distance between the first and second frames FR1 and FR2 can be adjusted by taking the rigidity of the first and second frames FR1 and FR2 or the flatness and elasticity of the display panel DP into consideration.

The first and second frames FR1 and FR2 are spaced apart from each other at the same distance due to the spacers SP. For instance, the distance between the first sides FR11 of the first frame FR1 and the third sides FR21 of the second frame FR2 is substantially the same as the distance between the second sides FR12 of the first frame FR1 and the fourth sides FR22 of the second frame FR2.

The spacer SP should not be limited to a specific kind of spacer as long as the spacer SP adjusts the distance between the first and second frames FR1 and FR2.

Figure 3:
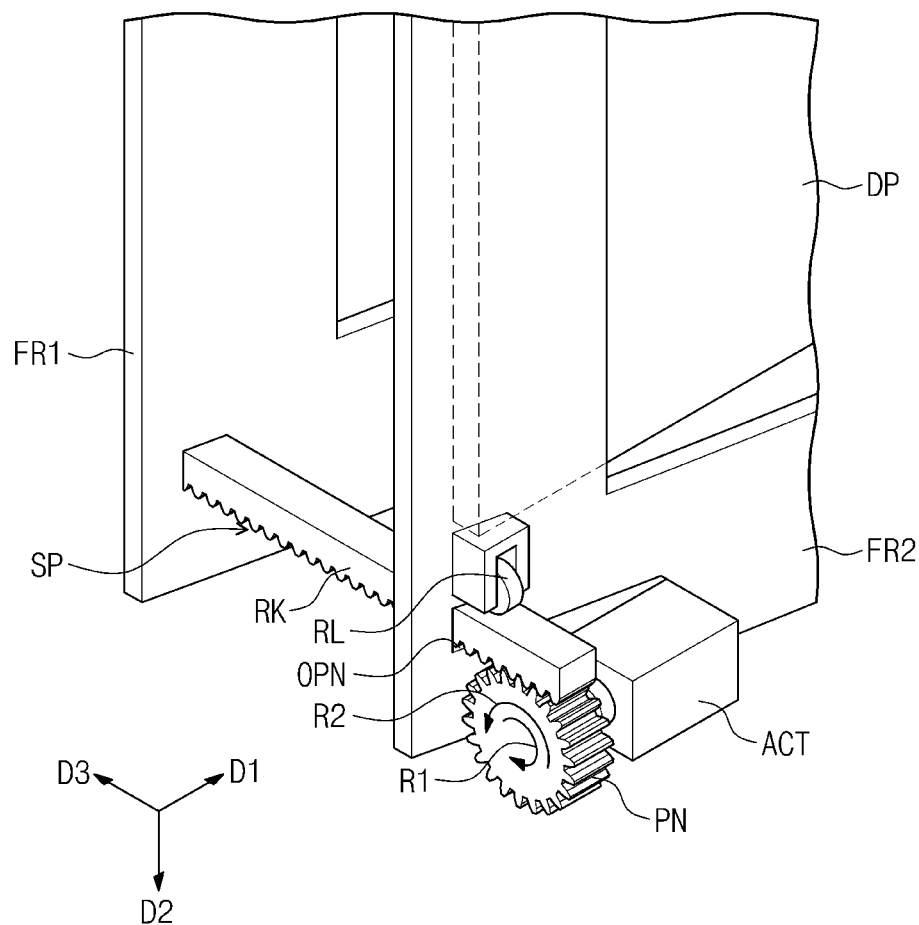
FIG. 3 is a partially-enlarged perspective view showing the portion P1 of FIG. 1 to illustrate a spacer of a display apparatus according to an exemplary embodiment.

FIG. 3 is a partially-enlarged perspective view showing the portion P1 of FIG. 1 to illustrate the spacer SP of the display apparatus according to an exemplary embodiment.

Referring to FIG. 3, the spacer SP includes a gear mechanism that includes a rack RK and a pinion PN. The rack RK is connected to one of the first and second frames FR1 and FR2 and the pinion PN is connected to the other of the first and second frames FR1 and FR2.

In the FIG. 3 embodiment, the rack RK is placed on the rear surface of the first frame FR1. The rack RK is attached to the rear surface of the first frame FR1 or assembled with the first frame FR1 to protrude toward the second frame FR2 after penetrating through the first frame FR1. The second frame FR2 is provided with an opening OPN formed therethrough, through which the rack RK penetrates and the rack RK protrudes from the rear surface of the second frame FR2 after penetrating through the opening OPN.

The pinion PN is directly or indirectly fixed to the second frame FR2 and the position of the second frame FR2 is determined in accordance with the movement of the pinion PN.

The pinion PN is placed on the rear surface of the second frame FR2 and engaged with the rack RK. Teeth are formed on each of the rack RK and the pinion PN and the teeth of the rack RK interlock with the teeth of the pinion PN. As a result, the distance between the first and second frames FR1 and FR2 increases or decreases based on the rotation of the pinion PN. For instance, when the pinion PN rotates in a clockwise direction R1, the distance between the first and second frames FR1 and FR2 decreases and when the pinion PN rotates in a counter-clockwise direction R2, the distance between the first and second frames FR1 and FR2 increases.

In the present exemplary embodiment, an actuator ACT, e.g., a motor, is connected to the pinion PN to drive the pinion PN, and thus the distance between the first and second frames FR1 and FR2 is adjusted by the rotational motion of the pinion PN controlled by the actuator ACT.

In addition, a roller RL is further provided on the second frame FR2. The roller RL contacts the rack RK and allows the rack RK to stably and smoothly move. The roller RL faces the pinion PN such that the rack RK is located between the roller RL and the pinion PN.

The display apparatus is selectively adjusted between the flat mode and the curved mode based on the degree of the bending of the display panel DP. In an embodiment, the flat mode should not be limited to only when the curvature of the display is zero. That is, the flat mode refers to when the curvature is zero or substantially zero. In addition, in the flat mode the user can recognize that the display apparatus is substantially flat since the curvature in the flat mode is substantially less than the curvature in the curved mode.

According to the present exemplary embodiment, the display apparatus can be curved such that a center portion of the display panel is father away from the user when the user views the display panel. However, the direction in which the display apparatus is curved should not be limited thereto or thereby. According to another embodiment, the display apparatus is curved such that the center portion of the display panel is closer to the user.

Hereinafter, the flat mode and the curved mode of the display apparatus will be described in detail with reference to figures.

Figure 4A:
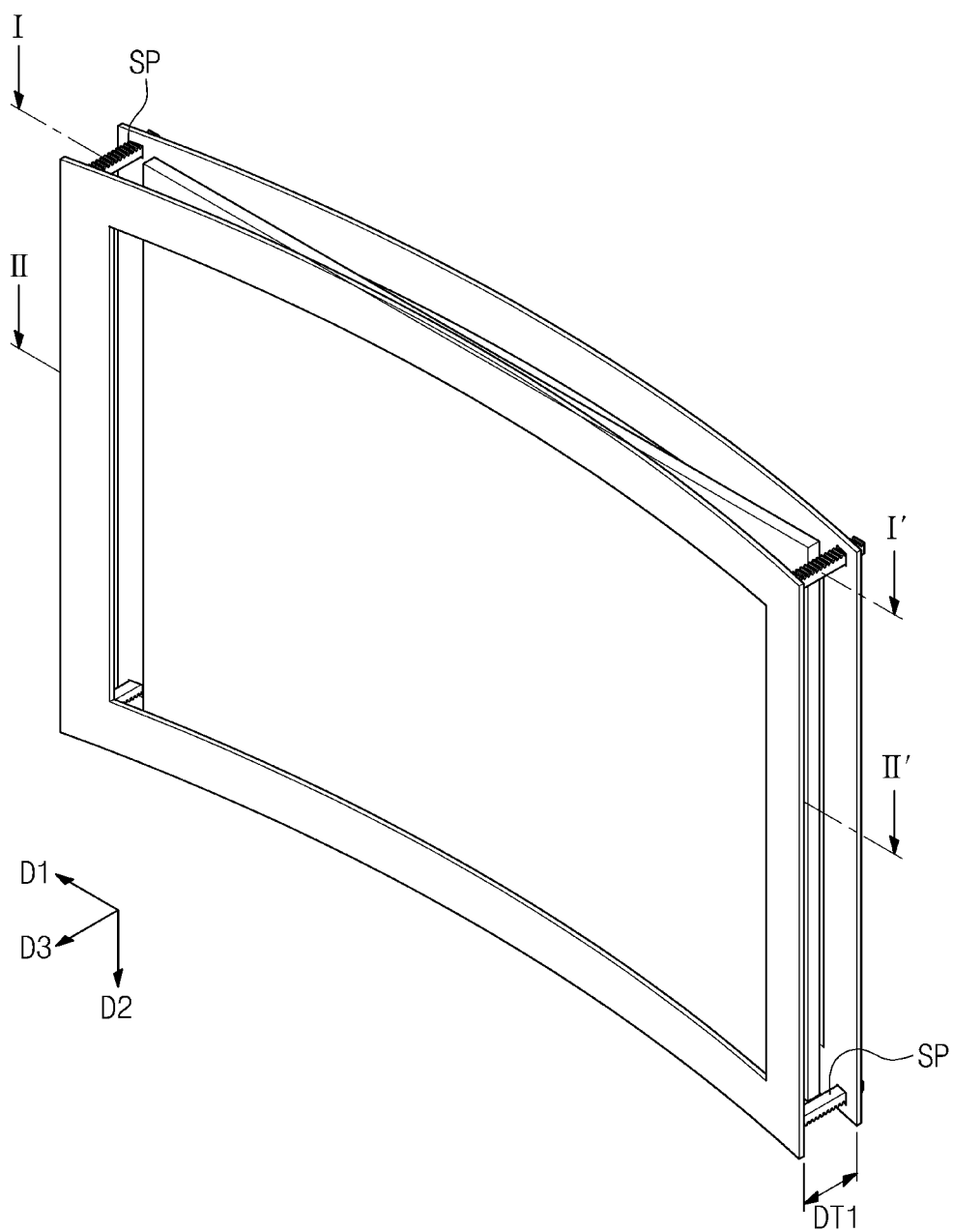
FIGS. 4A to 4C are plan and cross-sectional views showing the display apparatus according to an exemplary embodiment in a flat mode.
Figure 4B:
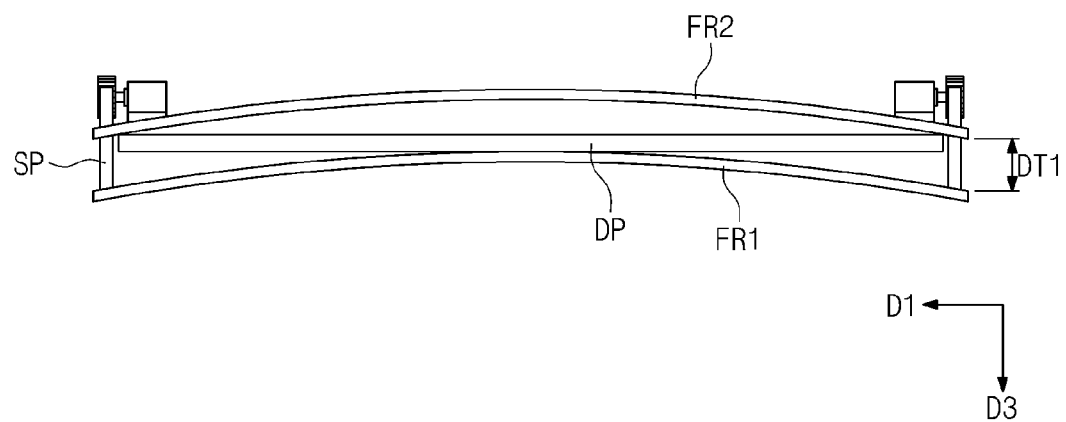
Figure 4C:
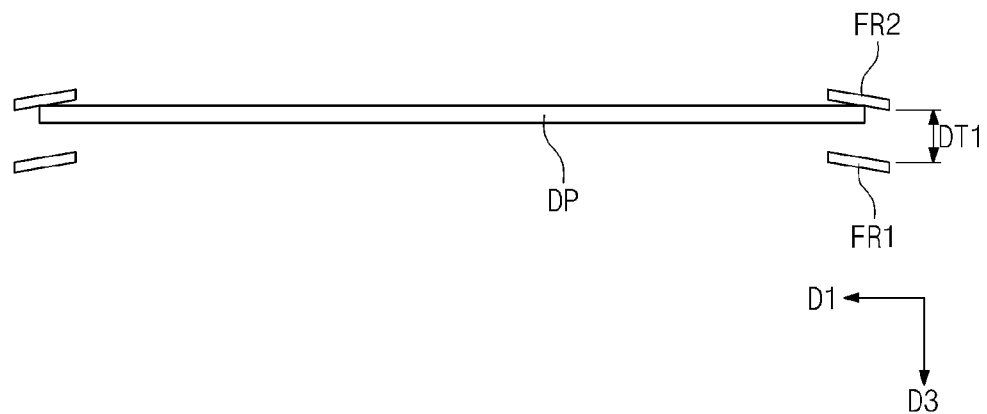

FIGS. 4A to 4C are plan and cross-sectional views showing the display apparatus in the flat mode. FIG. 4B is a cross-sectional view taken along line I-I' of FIG. 4A and FIG. 4C is a cross-sectional view taken along line II-IF of FIG. 4A.

Figure 5A:
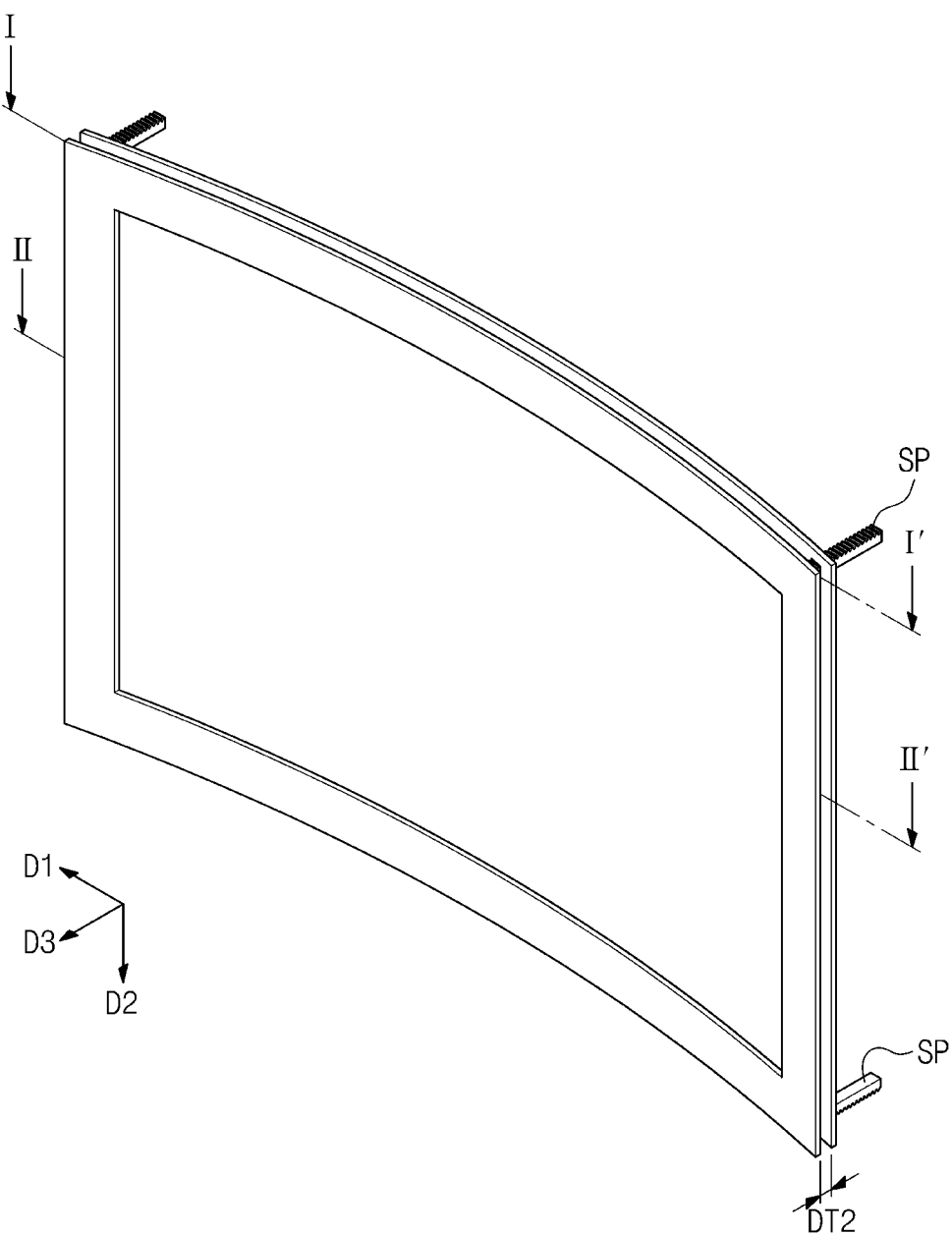
FIGS. 5A to 5C are plan and cross-sectional views showing the display apparatus according to an exemplary embodiment in a curved mode.
Figure 5B:
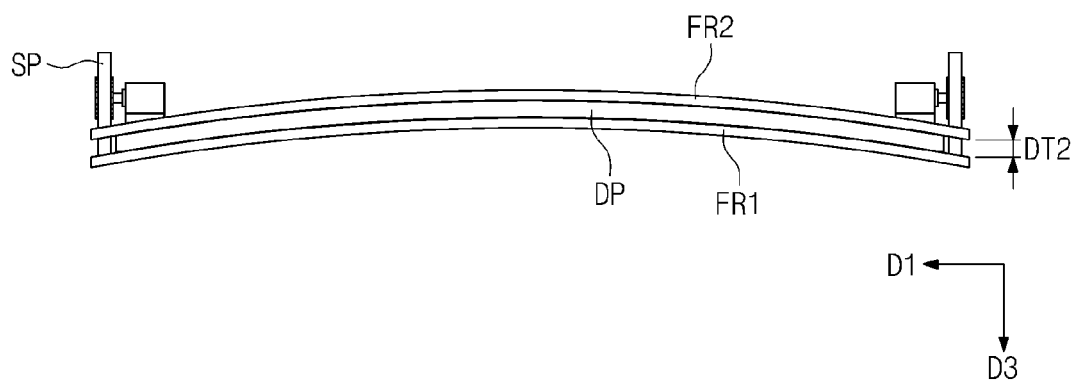
Figure 5C:
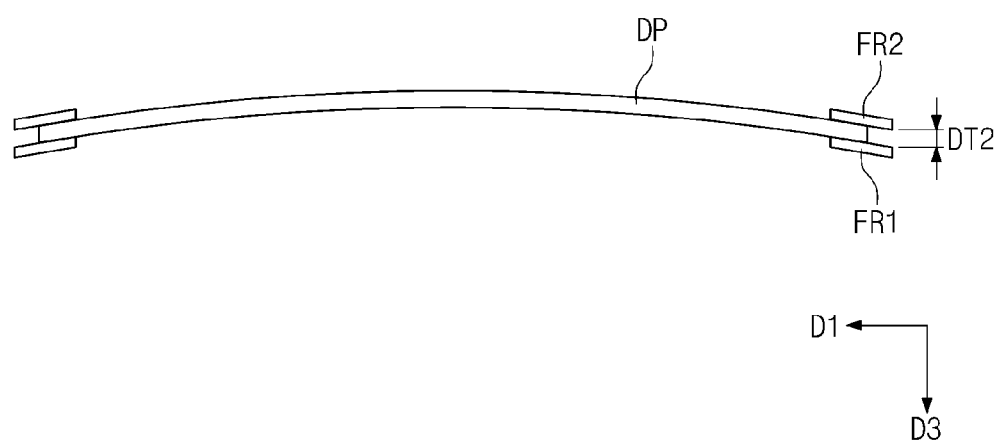

FIGS. 5A to 5C are plan and cross-sectional views showing the display apparatus in the curved mode. FIG. 5B is a cross-sectional view taken along line I-I' of FIG. 5A and FIG. 5C is a cross-sectional view taken along line II-II' of FIG. 5A.

Referring to FIGS. 1 and 4A to 4C, when the display apparatus is in the flat mode, the first frame FR1 and the second frame FR2 are spaced apart from each other at a first distance DT1. In the flat mode, a contact area between the first frame FR1 and the display panel DP is minimized such that the display panel DP is flat. For instance, the edge of the display panel DP contacts the second frame FR2 and the center portion of the display panel DP is spaced apart from the first frame FR1. Accordingly, the first distance DT1 is greater than the thickness of the display panel DP.

In an embodiment, the display panel DP maintains the flat mode since an external force is not applied to the display panel DP and the display apparatus remains in the flat mode.

Referring to FIGS. 1 and 5A to 5C, when the display apparatus is in the curved mode, the first frame FR1 and the second frame FR2 are spaced apart from each other at a second distance DT2. The second distance DT2 is a minimum distance between the first and second frames FR1 and FR2 when the display panel DP is placed between the first and second frames FR1 and FR2. The second distance DT2 is adjusted by controlling the spacer SP.

In the present exemplary embodiment, the second distance DT2 is substantially the same as the thickness of the display panel DP. The rear surface of the first frame FR1 completely contacts the front surface of the display panel DP and the front surface of the second frame FR2 completely contacts the rear surface of the display panel DP. In an embodiment, the display panel DP is applied with the external force by the curved first frame FR1 in a direction opposite to the third direction D3. Since the display panel DP is flexible, the display panel DP is curved to correspond to the curved shape of the first frame FR1. As a result, the display apparatus is maintained in the curved mode.

In the present exemplary embodiment, when the display apparatus is changed from the curved mode to the flat mode, the distance between the first and second frames FR1 and FR2 is changed to the first distance DT1. In this embodiment, when the external force applied to the display panel DP by the first and second frames FR1 and FR2 is removed, the display panel DP returns to the flat state due to its elastic force.

In the present exemplary embodiment, the shape of the display apparatus in the curved mode is determined depending on the shapes of the first and second frames FR1 and FR2. Therefore, the shape of the first and second frames FR1 and FR2 can be varied depending on the desired curve for the display apparatus.

For instance, a portion of the curved sides has a first curvature and the other portion of the curved sides has a second curvature different from the first curvature. In the present exemplary embodiment, the curvature of the curved sides of the first and second frames FR1 and FR2 increases as the distance from the center of the display apparatus toward at least one side corner increases.

According to another embodiment, in the curved sides of the first and second frames FR1 and FR2, each side is curved such that both portions of each side are asymmetrically curved with respect to a center of each side. In this embodiment, the curvature of one portion is different from the curvature of the other portion with respect to the center.

According to another embodiment, at least a portion of the curved sides of the first and second frames FR1 and FR2 has a curvature of zero and the other portion of the curved sides has a curvature greater than zero. In this embodiment, the curvature of the portions closer to the edge of the curved sides is zero and the curvature of the center portion between two edges has a predetermined value other than zero.

In the present exemplary embodiment, the shape of the display apparatus in the flat and curved modes is determined by the shapes of the first and second frames FR1 and FR2, but the display apparatus may have an intermediate shape between the flat mode and the curved mode by adjusting the distance between the first and second frames FR1 and FR2.

As described above, the display apparatus can be used in the flat mode or the curved mode in accordance with various conditions, e.g., the user's selection, the desired images to be displayed, etc., and the display apparatus is easily converted between the flat mode and the curved mode.

Figure 6:
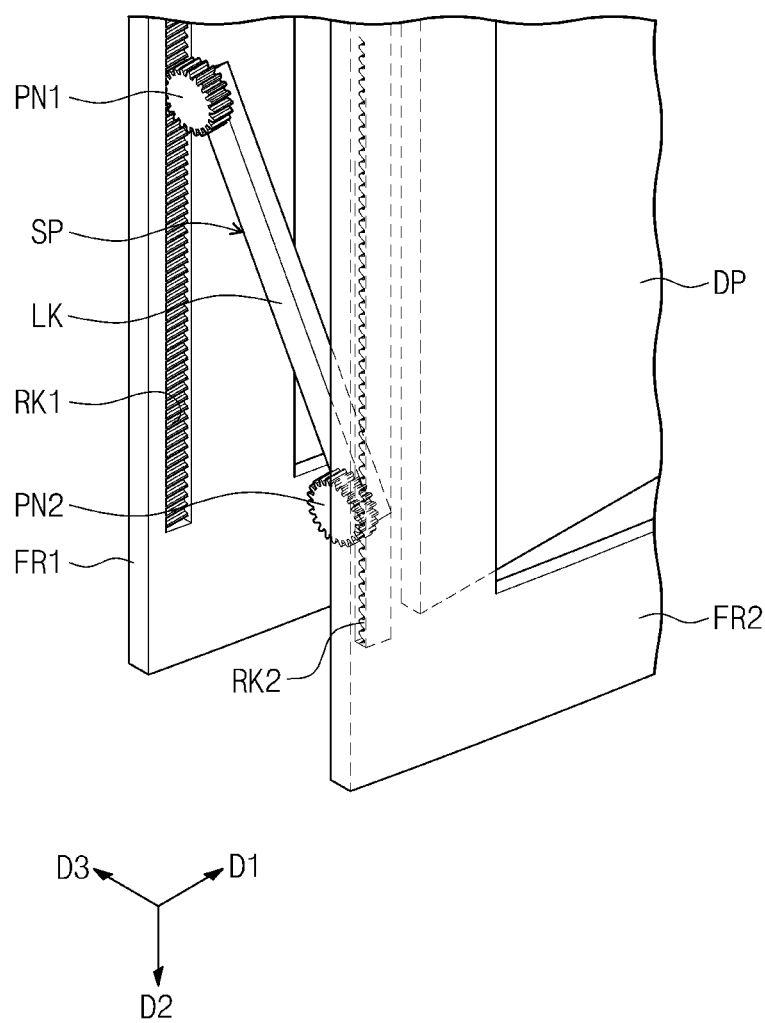
FIG. 6 is a partially-enlarged perspective view showing the portion P1 of FIG. 1 to illustrate a spacer of a display apparatus according to another exemplary embodiment.

FIG. 6 is a partially-enlarged perspective view showing a portion P1 of FIG. 1 to illustrate a spacer of a display apparatus according to another exemplary embodiment.

In the exemplary embodiment of FIG. 6, features of the spacer different from those of the spacer described with reference to FIG. 3 will be mainly described in order to avoid redundancy.

Referring to FIG. 6, the spacer SP includes two pairs of gears, each including a rack RK and a pinion PN. In detail, the spacer SP includes a first rack RK1 included in the first frame FR1, a first pinion PN1 connected to the first rack RK1, a second rack RK2 included in the second frame FR2, and a second pinion PN2 connected to the second rack RK.

In an embodiment, a link LK is provided between the first and second pinions PN1 and PN2 and the first and second pinions PN1 and PN2 are respectively provided at both ends of the link LK.

The first rack RK1 is arranged on the rear surface of the first frame FR1. The first rack RK1 is attached to the rear surface of the first frame FR1 after being separately manufactured or the first rack RK1 is integrally formed with the first frame FR1. FIG. 6 shows the first rack RK1 being integrally formed with the first frame FR1.

The second rack RK2 is arranged on the front surface of the second frame FR2. The second rack RK2 is attached to the front surface of the second frame FR2 after being separately manufactured or the second rack RK2 is integrally formed with the second frame FR2. FIG. 6 shows the second rack RK2 being integrally formed with the second frame FR2.

The first and second racks RK1 and RK2 are respectively engaged with the first and second pinions PN1 and PN2. That is, teeth are formed on each of the first rack RK1, the second rack RK2, the first pinion PN1, and the second pinion PN2. The teeth of the first rack RK1 interlock with the teeth of the first pinion PN1 and the teeth of the second rack RK2 interlock with the teeth of the second pinion PN2. As a result, the distance between the first and second frames FR1 and FR2 increases or decreases according to the rotational motion of the first and second pinions PN1 and PN2.

Although not shown in figures, one of the first and second pinions PN1 and PN2 may be connected to an actuator, e.g., a motor, and the distance between the first and second frames FR1 and FR2 can be adjusted by the rotational motion of the pinion connected to the actuator.

As described above, the spacer SP may have a variety of shapes or configurations. In addition, the shape of the spacer SP should not be limited to a rack and the pinion configuration as long as the spacer adjusts the distance between the first and second frames FR1 and FR2. For instance, the spacer SP may be a piston provided on one of the first and second frames FR1 and FR2 and protruding to the other of the first and second frames FR1 and FR2. Further, the spacer SP may be a pair of rods crossing each other in the form of the letter X using a hinge. In this embodiment, both ends of each rod are respectively connected to the first and second frames FR1 and FR2 using the hinge.

Figure 7:
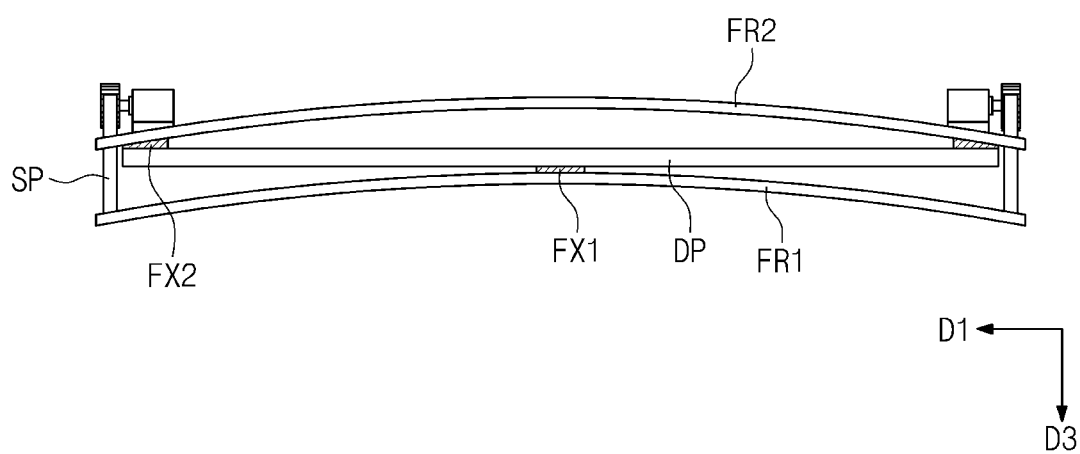
FIG. 7 is a cross-sectional view according to another exemplary embodiment.

FIG. 7 is a cross-sectional view according to another exemplary embodiment.

Referring to FIG. 7, the display apparatus further includes a fixing part FX1. The fixing part FX1 is arranged between the first frame FR1 and the display panel DP at the center of the first sides FR11. The fixing part FX1 contacts the display panel DP and fixes the display panel DP.

In addition, the display apparatus further includes a second fixing part FX2. The second fixing part FX2 is arranged between the display panel DP and the second frame FR2 at both ends of the first sides FR11. The second fixing part FX2 contacts the display panel DP and fixes the display panel DP.

Each of the first and second fixing parts FX1 and FX2 may be an adhesive layer, a clip, or a hook, but should not be limited thereto or thereby, as long as the first and second fixing parts FX1 and FX2 fix the display panel DP. In addition, each of the first and second fixing parts FX1 and FX2 may include a protrusion and an insertion hole into which the protrusion is inserted.

In the present exemplary embodiment, each of the first and second fixing parts FX1 and FX2 includes a plurality of fixing parts.

The first and second fixing parts FX1 and FX2 fix the display panel DP such that the display panel DP maintains a flat plate shape having a curvature of about zero. In particular, when the display panel DP has a large size and flexibility, the display panel DP may be curved even though the display panel DP is in the flat mode. For instance, the display panel DP may be curved due to gravity acting on it in the flat mode.

The first fixing parts FX1 and/or the second fixing parts FX2 maintain the display panel to be substantially flat in the flat mode.

Although the exemplary embodiments of the inventive technology have been described, it is understood that the invention should not be limited to these exemplary embodiments but various changes and modifications can be made by one ordinary skilled in the art within the spirit and scope of the invention as hereinafter claimed.

What is claimed is:

1. A display apparatus, comprising:
    a flexible display panel configured to display images;
    a first frame arranged on the front surface of the flexible display panel and curved in a first direction;
    a second frame arranged on a rear surface of the flexible display panel and curved in the first direction; and
    at least one spacer arranged on at least one of the first and second frames and continuously between the first and second frame, wherein the spacer is configured to adjust the distance between the first and second frames.

2. The display apparatus of claim 1, wherein the first and second frames are arranged along edges of the display panel.

3. The display apparatus of claim 2, wherein the flexible display panel is further configured to i) have a substantially flat shape when the distance between the first and second frames is a first distance and ii) have a curved shape when the distance between the first and second frames is a second distance and wherein the first distance is greater than the second distance.

4. The display apparatus of claim 3, wherein the second distance is substantially equal to the thickness of the display panel.

5. The display apparatus of claim 4, wherein the display panel is curved in the first direction when the display panel has the curved shape and wherein the edges of the display panel contact the first frame when the display panel has the curved shape.

6. The display apparatus of claim 2, wherein the first frame comprises a pair of first sides substantially parallel to each other and a pair of second sides substantially parallel to each other.

7. The display apparatus of claim 6, wherein the first sides are curved in the first direction.

8. The display apparatus of claim 7, wherein the second sides are curved in a second direction substantially perpendicular to the first direction.

9. The display apparatus of claim 7, wherein a portion of the first sides has a first curvature and the remaining portion of the first sides has a second curvature different from the first curvature.

10. The display apparatus of claim 1, further comprising a first fixing part arranged at the center of the first sides between the first frame and the display panel, wherein the first fixing part is configured to: i) contact the display panel and ii) fix the display panel.

11. The display apparatus of claim 10, further comprising a second fixing part arranged at opposing ends of the first sides between the display panel and the second frame, wherein the second fixing part is configured to: i) contact the display panel and ii) fix the display panel.

12. The display apparatus of claim 1, wherein the at least one spacer comprises a plurality of spacers.

13. The display apparatus of claim 12, wherein the spacers are arranged at positions corresponding to at least two vertices of the display panel.

14. The display apparatus of claim 12, wherein each of the spacers comprises a rack connected to one of the first and second frames and a pinion connected to the other of the first and second frames.

15. A display apparatus, comprising:
    a flexible display panel configured to display images;
    a first frame arranged on the front surface of the flexible display panel and curved in a first direction;
    a second frame arranged on a rear surface of the flexible display panel and curved in the first direction; and
    a plurality of spacers arranged on at least one of the first and second frames, wherein the plurality of spacers are configured to adjust the distance between the first and second frames,
    wherein each of the spacers comprises:
    a first rack arranged on the first frame;
    a first pinion engaged with the first rack;
    a second rack arranged on the second frame;
    a second pinion engaged with the second rack; and
    a link connecting the first pinion to the second pinion.

16. A display apparatus, comprising:
    a flexible display panel configured to operate in a flat mode and a curved mode, wherein the flexible display panel comprises a display area configured to display images and a non-display area surrounding the display area;
    a pair of frames formed on opposing sides of the display area and overlapping the non-display area of the flexible display panel; and
    a spacer arranged continuously between the pair of frames and configured to transition the flexible display panel between the flat mode and the curved mode.

17. The display apparatus of claim 16, wherein at least one of the frames does not overlap the display area of the flexible display panel.

18. The display apparatus of claim 16, wherein the curvature of the flexible display panel is configured to substantially match the curvature of the pair of frames in the curved mode.

* * * * *